United States Patent [19]

Gurnee

[11] Patent Number: 4,812,668

[45] Date of Patent: Mar. 14, 1989

[54] MULTIPLEXER ELEMENTS FOR PHOTOVOLTAIC DETECTORS

[75] Inventor: Mark N. Gurnee, Framingham, Mass.

[73] Assignee: Honeywell Inc., Minneapolis, Minn.

[21] Appl. No.: 129,323

[22] Filed: Nov. 30, 1987

[51] Int. Cl.$^4$ .................... H01J 40/14; H01L 27/14
[52] U.S. Cl. ...................... 250/578; 357/30
[58] Field of Search ............ 250/211 J, 578; 357/24, 357/24 LR, 30; 377/60

[56] References Cited

U.S. PATENT DOCUMENTS

| | | | |
|---|---|---|---|
| 3,760,202 | 9/1973 | Kosonocky | 357/24 |
| 3,940,602 | 2/1976 | Lagnado et al. | 357/30 H |
| 3,987,474 | 10/1976 | Walker | 357/30 H |
| 4,028,719 | 6/1977 | Curtis | 357/30 |
| 4,093,872 | 6/1978 | Hartman et al. | 377/60 |
| 4,121,117 | 10/1978 | Hoffmann et al. | 357/24 |
| 4,306,160 | 12/1981 | Hamilton | 357/24 |
| 4,349,749 | 12/1982 | Pfleiderer et al. | 357/24 |
| 4,359,651 | 11/1982 | Bluzer | 357/24 LR |
| 4,366,550 | 12/1982 | Lampe | 357/24 |
| 4,473,836 | 9/1984 | Chamberlain | 357/24 LR |
| 4,486,893 | 12/1984 | Carrison | 357/24 |
| 4,521,896 | 6/1985 | Borsuk et al. | 377/60 |
| 4,554,571 | 11/1985 | Arques | 377/60 |
| 4,598,320 | 7/1986 | Arques | 358/213 |

Primary Examiner—David C. Nelms
Assistant Examiner—William L. Oen
Attorney, Agent, or Firm—John S. Solakian; George A. Leone, Sr.

[57] ABSTRACT

A multiplexer cell particularly adapted for multiplexing the output signals of photovoltaic detectors and which when appropriately connected together form a random access multiplexer for the photovoltaic detectors located in a large focal plane of a photosensing device. Each multiplexer cell includes an input circuit to which the input signal current from a detector is applied. A charge is stored in a storage well, the magnitude of which is an integration over an integration period of the input signal from a detector. The output of the input circuit is an output voltage produced by a sensor in close proximity to the storage well. The output voltage is a function of the magnitude of the charge stored during each integration period. Each multiplexer cell also includes a random access multiplexer output circuit to which the output voltage signal produced by its associated input circuit is applied. When two concurrently applied enabling signals are applied to the "X" and "Y" control gates of the output circuit a current flows from the source of the output circuit to its output node. The output node is charged to a potential equal to that of the control gate to which the output voltage of the input circuit is applied. A low impedance source of electric energy is connected to the source of the output node so that capacitance of the output nodes of a large number of such cells when connected together does not reduce the magnitude voltage of the output signal of the multiplexer.

15 Claims, 2 Drawing Sheets

MULTIPLEXER ELEMENTS FOR PHOTOVOLTAIC DETECTORS

This application is a continuation of application Ser. No. 853,300, filed Apr. 17, 1986 now abandoned.

BACKGROUND OF THE INVENTION

1. Field of the Invention

This invention is in the field of random access multiplexers for multiplexing signals from photovoltaic (PV) detectors from a large array of such detectors located in the focal plane of a photosensing device, and more particularly, relates to multiplexer elements, or cells, of a multiplexer each of which is capable of integrating signals from a photovoltaic detector, of providing a low noise readout, and of providing random access to the integrated signals of each photovoltaic detector of a large array of such detectors.

2. Description of the Prior Art

The usual prior art approach to multiplexing signals from photovoltaic detectors of a large array of detectors onto one or more output lines is to collect charge packets at an input site of the multiplexer, there being one input site for each detector. The magnitude of the charge collected in a given period of time at each site is representative of, or a function of, the detector signal. There are two basic ways of reading out the signals accumulated at each input site. One is by using charge integrating devices (CIDs) and a second is by using charge coupled devices (CCDs). In a CID, the integrated charge packet is transferred to a sense electrode, the voltage of which is proportional to the input charge divided by the capacitance of the sense electrode. CIDs can provide random access readout, however, they are limited to use with smaller arrays of detectors because the capacitance of the sense electrode, or node, increases as the number of detectors of the array increases, with the result that the output signal voltage decreases because of the increase in capacitance of the sense electrodes. As a result, the signal to noise ratio rapidly decreases to unacceptable levels as the number of detectors of the array increases.

CCDs transfer the input charge packet from an input well to an output node by transferring the charge packet for each detector of the array from one potential well to the next in a series of such wells constituting the CCD. Use of CCDs is limited by the dynamic range of CCDs, by noise, and by fixed pattern artifacts introduced as a charge packet is transferred from one potential well to the next.

A third approach to multiplexing signals from a large number of voltaic detectors is to use a switched array which sequentially switches each detector to a common output line. Such an approach allows random access to each photovoltaic detector's output signal, but has a high background noise as the result of the non-integrating, non-band width limiting characteristics of the signal transfer process.

BRIEF SUMMARY OF THE INVENTION

The present invention provides an improved multiplexer cell which can be used to provide a random access multiplexer for photovoltaic detectors of a photosensing device such as an infrared detector. Each photovoltaic detector of a large array of such detectors located in the focal plane of a photosensing device produces a detector signal current, the magnitude of which is a function of the intensity of the electromagnetic radiation incident on the detector. Each multiplexer element includes a silicon (MOS) field effect input device or circuit formed on a semiconductor substrate. The source of the input circuit has applied to it the signal produced by one photovoltaic detector. Associated with the source of the input circuit is a well gate, or electrode, a control gate, and a reset gate. A sense electrode is made by diffusing a dopant into the substrate to form a diffusion adjacent to the well gate in contact with the potential well formed beneath the well gate. A reset voltage pulse applied to the reset gate removes any charge stored, or accumulated, in the potential well beneath the well gate prior to each integration period. During each integration period an integration pulse (or dc voltage) of the proper voltage and amplitude is applied to the control gate to permit the signal charge carriers to flow from the detector through the source into the potential well formed under the well gate which is formed by applying a well gate potential of the appropriate magnitude and polarity to the well gate. At the end of each signal integration period, the voltage on the sense electrode is proportional to the total integrated (and hence band-limited) signal. The voltage of the sense electrode is applied to the control gate of a fill and spill output circuit having a source, an "X" and a "Y" gate and an output node. The source of the output circuit is connected to a low impedance source of fill and spill current. Minority carriers flow from the source of the output circuit to the output node when enabling pulses of the appropriate magnitude and polarity corresponding to the "X" and "Y" coordinates of the photovoltaic detector connected to the source of the cell are applied thereto. The output circuit will transfer enough charge to the output node so that the voltage of the output node substantially equals the magnitude of the signal voltage applied to the control gate of the enabled output circuit even when the output node has a high capacitance due to a large number of cells being connected to a common output line.

It is therefore an object of this invention to provide an improved multiplexer element for photovoltaic detectors.

It is yet another object of this invention to provide an improved multiplexer element which in association with other such elements forms a random access multiplexer for a large number of photovoltaic detectors.

It is still another object of this invention to provide a multiplexer cell having a low noise integrating detector signal input circuit and a low noise random access readout circuit.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENT

Figure 1:
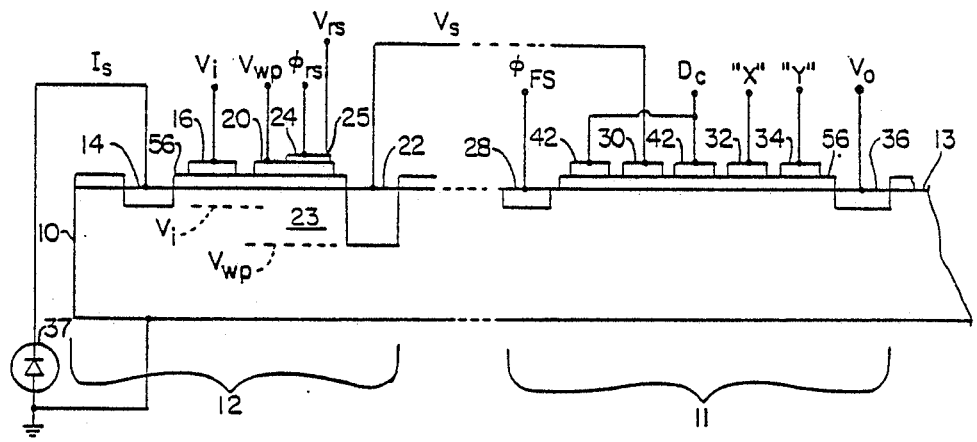
FIG. 1 is a cross-sectional view, partly schematic, of a multiplexer element for a photovoltaic detector in accordance with one embodiment of the invention.

In FIG. 1, a p-type semiconductor substrate 10 has a detector signal integrating input circuit 12, and a readout circuit 11, formed on its upper surface 13. Circuit 12 has a source 14, a control gate 16, and a well gate 20. Sense electrode 22 is formed by an appropriate dopant diffused into substrate 10 so that the type of conductivity of electrode 22 is opposite that of substrate 10. In the preferred embodiment sense electrode 22 is an "n" type material. Sense electrode 22 is located so as to be in intimate contact with the charge collected in, or integrated by, potential well 23 formed under gate 20 to allow the potential, or voltage of the charge stored, or accumulated, in potential well 23 to be sensed and utilized.

Figure 3:
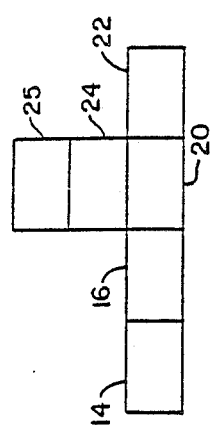
FIG. 3 is a schematic plan diagram view of the detector signal integrating input circuit of FIG. 1.

Reset gate 24 and drain 25 are located adjacent to well gate 20 as is best illustrated in FIG. 3. A reset voltage pulse $\phi_{rs}$ is periodically applied to reset gate 24 to remove any charge stored in potential well 23 prior to each integration period. Also formed on substrate 10 is MOS field effect multigate fill and spill output circuit 11. Output circuit 11 has a source 28, a control gate 30, shield gates 42, an "X" gate 32 and a "Y" gate 34 as well as an output node 36.

Photovoltaic detector 37 is one of a plurality of detectors forming a large array lying, or located, in the focal plane of a photosensing device. Photovoltaic detector 37 produces an output signal current, $I_s$, the magnitude of which is a function of the intensity of the electromagnetic radiation incident on, or focused on detector 37 at any given instant of time. Detector output signal current $I_s$, is applied to source 14 of input circuit 12, and the voltage sensed by sense electrode 22 of input circuit 12 is applied to control gate 30 of output circuit 11.

A multiplexer element, or cell, 38 consists of a detector signal integration input circuit 12 and a multigate fill and spill random access output circuit 11. Detector signal current $I_s$ is permitted to flow into and collect in, or to be integrated, for a given integration period, or frame of time, determined by a timing pulse $V_i$ of appropriate polarity, magnitude and time of duration to permit minority carriers, electrons in the preferred embodiment, to flow from source 14 into potential well 23 formed beneath well gate 20. The potential applied to well gate 20 $V_{wp}$ is of an appropriate polarity and magnitude to form a potential well as indicated by the dashed line $V_{wp}$ illustrated in FIG. 1. Voltage $V_{wp}$ is positive in the preferred embodiment and forms potential well 23, a depletion region in the p-type silicon beneath gate 20. To assure that the charge collected, or integrated, in potential well 23 during each integration period is as accurate as possible, it is necessary that well 23 be empty of minority carriers prior to the beginning of each integration period. This is accomplished by applying a reset pulse $\phi_{rs}$ to reset gate 24 before the start of each integration period. The magnitude of $\phi_{rs}$ is greater than $V_{wp}$ so that the charge accumulated in well 23 is transferred to the drain 25 where it is dispersed prior to integrating a new signal charge packet into well 23. Sense electrode 22 allows the potential of the charge in well 23 to be monitored, or sensed. At the end of each integration period, or time frame, the voltage of sense electrode 22, $V_s$, is a function of the integrated charge collected in well 23 during the immediately preceding integration period.

The signal voltage $V_s$ is applied to control gate 30 of output circuit 11. Signal voltage $V_s$ determines, or sets, the potential of output voltage $V_o$ at output node 36 of circuit 11 when enabling select voltage pulses are applied to "X" control gate 32 and "Y" control gate 34 of fill and spill output circuit 11 and the output circuit source 28 is clocked to zero voltage and then to a voltage higher than $V_s$.

Figure 4:
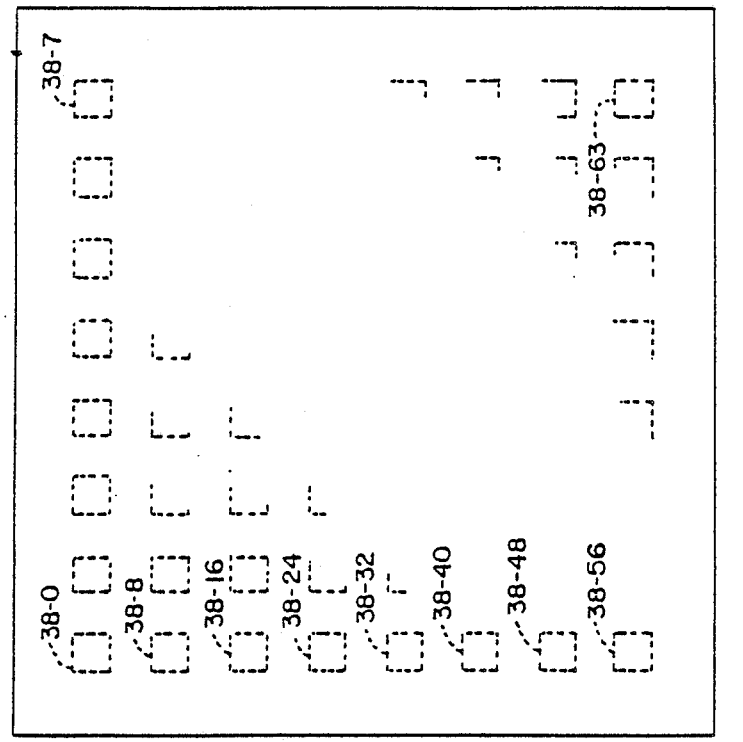
FIG. 4 is a schematic plan view of a random access multiplexer formed on a single semiconductor substrate comprising a large number of multiplexer elements.

In FIG. 4 the manner in which sixty-four multiplexer elements, or cells 38-0 to 38-63 can be formed and located on the surface 13 of substrate 10 to form multiplexer 39 is illustrated. The source 14 of the input circuit 12 of each cell 38 is connected to a different photodetector 37 of an array of such detectors lying in the focal plane of a photosensing device. The "X" and "Y" coordinates of each detector 37 correspond to one of the multiplexer elements 38-0 through 38-63 of multiplexer 39 illustrated schematically in FIG. 4. All of the output nodes 36 of the multiplexer cells 38 can be connected together and thus may be common to all of the multiplexer cells 38 on one or more substrates 10, of multiplexer 39 for example. By use of appropriate decoding circuits, which are not illustrated, binary signals representing the "X" and "Y" coordinates of a given detector 37 in an array of such detectors can apply select enabling pulses to the "X" gate 32 and the "Y" gate 34 of one and only one of the multiplexer elements 38 of multiplexer 39 at one instant in time. When both "X" gate 32 and "Y" gate 34 of a given cell 38 are enabled, its output node 36 is charged to a potential substantially equal to that of $V_s$ applied to the control gate of the output circuit 11 so enabled. Since the current used to charge output node 36 of the enabled or selected cell 38 comes from a conventional low impedance fill and spill source $\phi_{fs}$ which is not illustrated rather than from the detector input circuit 12, increases in the magnitude of the capacitance of the output node 36 as the number of such nodes which are electrically connected together increases, does not reduce the amplitude of the output signal $V_0$ of the enabled output circuit 11. Control gate 30 of output circuit 11 can be provided with guard electrodes 42 which are connected to a suitable source of direct current potential D.C. to further isolate control electrode 30.

Figure 2:
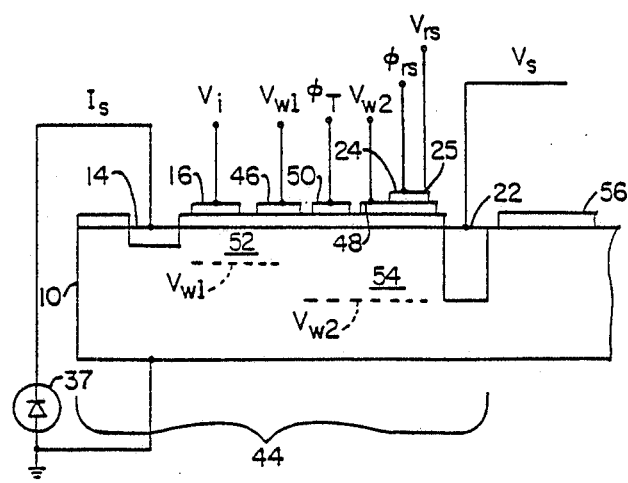
FIG. 2 is a cross-sectional view, partly schematic, of a modification of the detector signal integrating input circuit illustrated in FIG. 1.

In FIG. 2 a modification of detector signal integrating input circuit 44 is illustrated. Input circuit 44 is provided with two well gates 46 and 48 separated by transfer gate 50. Input circuit 44 permits the input current $I_s$ from a photovoltaic detector 37 to be collected or integrated in the potential well 52 beneath well gate 46 as the result of potential $V_{w1}$ being applied to gate 46. At the end of each integration period the charge packet in well 52 is transferred by a transfer pulse applied to transfer gate 50 into well 54 formed beneath well gate 48 by potential $V_{w2}$ being applied to gate 48. Input circuit 44, by having two potential wells, 52 and 54 permits the charge accumulated in well 52 during one integration period to be held in well 54 until such time during the next succeeding integration period as the "X" and "Y" gates of the output circuit 26 of the associated multiplexer cell 38 are both enabled to produce output voltage $V_o$ having a magnitude substantially equalling that of the charge stored in well 54. Circuit 44, thus, permits the integration of the output signal $I_s$ from its associated photovoltaic detector 37 and concurrently the random access readout of the integrated charge packet stored in well 54. The functions of source 14, control gate 16, sense electrode 22, reset electrode 24, and drain gate 25 of input circuit 44 are the same as described with respect to input circuit 12 illustrated in FIG. 1.

Gates 16, 20, 24, 30, 32, 34, 42, 46, 48 and 50 are electrically insulated from semiconductor substrate 10 by a thin insulating layer 56 formed on the upper surface 13 of substrate 10. Typically layer 56 is a thin layer of silicon dioxide $S_iO_2$. It will be appreciated that while substrate 10 is disclosed as being a p-type semiconductor in the preferred embodiment, an n-type semiconductor could be used with a reversal of the polarity of the applied voltages and with sense electrode 22 being a p-type semiconductor.

From the foregoing it is believed to be clear that this invention provides improved multiplexer elements, or cells, including a low noise input circuit capable of integrating detector input signals and a low noise random access output circuit for applying an output signal representative of the signals produced by the photodetectors of an array of such detectors to a common output line.

What is claimed is:

1. A multiplexer cell for a photovoltaic detector comprising:
    input circuit means responsive to an input signal current for storing a charge which is a function of the input signal current over a predetermined integrating period of time periodically repeated, and for producing an output voltage signal which is a function of the magnitude of the charge stored during each of said integration periods; and
    output circuit means responsive to the output voltage signal produced by the input circuit means and at least two concurrently applied enabling select signals for producing an output circuit output signal the magnitude of the voltage of which substantially equals the output voltage signal produced by the input circuit means.

2. A multiplexer cell as defined in claim 1 in which the input circuit means further includes means for removing the charge stored by the means for storing prior to each of said integration periods.

3. A multiplexer cell as defined in claim 1 in which the input circuit means for storing has two means for forming potential wells for storing charges, one of which potential wells is used to accumulate charge coming from a source of the input circuit means during each integration period and the second of which holds the charge accumulated in the first well during the immediately preceding integration period.

4. A multiplexer cell as defined in claim 2 in which the output circuit means includes a source, three insulated control gates and an output node, the output voltage signal of the input circuit means being applied to the first insulated control gate, and the applied enabling signals are applied to the other two control gates respectively, the output voltage of the output circuit means being produced at the output node.

5. A multiplexer cell as defined in claim 4 in which a low impedance source of electric potential is applied to the source of the output circuit means.

6. A multiplexer cell for photovoltaic detector comprising:
    photovoltaic detector means for producing a detector signal current, the magnitude of which is proportional to the intensity of incident electromagnetic radiation;
    means for storing a charge which is an integration of the magnitude of the current applied thereto over an integration period of time, which integration periods occur periodically;
    means prior to each integration period for removing any charge stored in the means for storing during any prior integration period;
    means for applying the detector signal current to the means for storing a charge;
    voltage sensing means for sensing the voltage of the charge stored in the means for storing during an integration period;
    circuit means having a source, first, second, and third gates and an output node responsive to the voltage sensed by the voltage sensing means which is applied to the first gate for charging the output node to the voltage of the first gate when the second and third gates are enabled by at least two concurrently applied enabling select signals.

7. A multiplexer cell as defined in claim 6 in which the means for storing a charge includes a source, a control gate and a first well gate, the detector signal current being connected to the source by the means for applying the detector signal current.

8. A multiplexer cell as defined in claim 7 in which the means for storing further includes a second well gate, the first well gate for storing a charge stored therein during an integration period and the second well gate for holding the charge stored by the first gate during the immediately preceding integration period.

9. A multiplexer as defined in claim 7 in which the voltage means for sensing the voltage of the charge stored during an integration period is a diffusion in intimate contact with a storage well formed beneath the first well gate.

10. A multiplexer cell as defined in claim 9 in which the means for removing a charge stored in the means for storing during any prior integration period includes a reset gate to which is periodically applied a reset voltage pulse, and a reset drain to which is applied a voltage of level sufficiently high to drain all the stored charge from the means for storing.

11. A multiplexer for a plurality of photodetectors comprising:
    a plurality of multiplexer cells formed on a semiconductor substrate, each multiplexer cell being associated with a photovoltaic detector, each photovoltaic detector producing a detector signal which is a function of the intensity of electromagnetic radiation incident on each detector;
    each multiplexer cell comprising input circuit means responsive to the detector signal of its associated photodetector for storing a charge which is a function of the detector signal during a predetermined integration period of time and for producing an output voltage which is a function of the magnitude of the charge stored during each integration period; and output circuit means, responsive to the output voltage produced by the input circuit means and an "X" coordinate and a "Y" coordinate enabling signal concurrently applied to control gates of the output circuit means for producing an output voltage signal at an output node of the output circuit means; and means for electrically interconnecting all the output nodes of the plurality of multiplexer cells, said output circuit having the power to charge the capacitance of the output nodes to a voltage substantially equal to the output voltage produced by the input circuit means applied to the enabled cell.

12. A multiplexer as defined in claim 11 in which the input circuit means of each multiplexer cell further includes means for removing the charge stored by the input circuit means prior to each integration period.

13. A multiplexer as defined in claim 11 in which the input circuit means for storing a charge has means for forming two potential wells for storing charges, one of which is used to accumulate charge carriers during each integration period, and the second of which holds the charge accumulated in the first well during the preceding integration period.

14. A multiplexer as defined in claim 12 in which the output circuit means includes a source, three insulated control gates and an output node, the output voltage signal of the input circuit means being applied to the first signal control gate and the enabling signals being applied respectively to the other two control gates, the output voltage being produced at the output node.

15. A multiplexer as defined in claim 14 in which a low impedance source of electric power is applied to the source of the output circuit means.

* * * * *